(12) United States Patent
Stettner et al.

(10) Patent No.: US 6,201,257 B1
(45) Date of Patent: *Mar. 13, 2001

(54) SEMICONDUCTOR X-RAY PHOTOCATHODES DEVICES

(75) Inventors: Roger Stettner; Howard W. Bailey, both of Santa Barbara, CA (US)

(73) Assignee: Advanced Scientific Concepts, Inc., Santa Barbara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 09/120,613

(22) Filed: Jul. 22, 1998

Related U.S. Application Data (63) Continuation-in-part of application No. 08/722,448, filed on Oct. 10, 1996, now Pat. No. 5,804,833.
(60) Provisional application No. 60/059,097, filed on Sep. 16, 1997.

(51) Int. Cl.$^7$ .................................................. H01L 31/00
(52) U.S. Cl. ............................. 257/10; 257/11; 257/233; 257/442; 257/443; 257/466; 313/309; 313/336; 313/351; 313/500; 313/501
(58) Field of Search ................................. 257/10, 11, 442, 257/443, 466, 233; 313/309, 336, 351, 500, 501

(56) References Cited

U.S. PATENT DOCUMENTS

| | | | |
|---|---|---|---|
| 3,812,559 | * 5/1974 | Spindt et al. | 29/25.18 |
| 5,140,162 | * 8/1992 | Stettner | 250/370.09 |
| 5,304,815 | * 4/1994 | Suzuki et al. | 257/10 |
| 5,646,479 | * 7/1997 | Troxell | 313/495 |
| 5,804,833 | * 9/1998 | Stettner et al. | 257/10 |

\* cited by examiner

*Primary Examiner*—William Mintel
(74) *Attorney, Agent, or Firm*—Gottlieb, Rackman & Reisman, P.C.

(57) ABSTRACT

An energy dispersive x-ray and gamma-ray photon counter is described. The counter uses a photon sensor which incorporates a unique photocathode called Advanced Semiconductor Emitter Technology for X-rays (ASET-X) as its critical element for converting the detected photons to electrons which are emitted into a vacuum. The electrons are multiplied by accelerations and collisions creating a signal larger than the sensor noise and thus allowing the photon to be energy resolved very accurately, to within ionization statistics. Because the signal is already above the sensor noise it does not have to be noise filtered therefore allowing high-speed counting. The photon sensor can also be used as a device to visualize and image gamma-ray and x-ray sources.

39 Claims, 6 Drawing Sheets

SEMICONDUCTOR X-RAY PHOTOCATHODES DEVICES

This application is a continuation-in-part of application Ser. No. 08/722,448, filed Oct. 10, 1996, now U.S. Pat. No. 5,804,833 and U.S. Provisional Patent Application Ser. No. 60/059,097, filed Sep. 16, 1997.

FIELD OF THE INVENTION

This invention relates to x-ray photocathode devices and detectors. In particular, it relates to photocathodes combining solid-state detector and emitter technologies. It also pertains to x-ray and gamma-ray detectors which discriminate photon energy and high-speed x-ray or gamma-ray photon counters. This invention also relates to sensors that visualize or image x-ray or gamma-ray sources.

BACKGROUND OF THE INVENTION

Conventional photocathodes are used in a number of photon amplifier applications including photomultipliers (PMTs), microchannel-plate (MCP) amplifier tubes and Digicons. The photocathode detects the photon and emits an electron. The electron (i.e., the photoelectric current) is amplified by one of the previously mentioned technologies and the resulting signal is larger than the sensor noise. This amplification generally eliminates the need for extensive noise filtering and allows high-speed photon counting and energy-discrimination operations. However, conventional photocathodes and newer transferred electron photocathodes have relatively low quantum efficiencies and respond to photons in a very limited spectral range around the visible spectrum, from the long wavelength ultraviolet to the near infrared: wavelengths from about 0.1 microns to 1.7 microns. Quantum efficiency in this context refers to the average number of electrons emitted per incident photon of a given wavelength. PMTs, a particular electron amplifier using dynodes, are applied in a number of medical and visible-laser detection applications. Microchannel Plate (MCP) amplifier tubes are used in similar applications but because of their multiple-pixel imaging capability they are also used in night-vision goggles and imaging laser radar (LADAR). Night-vision MCP image tubes are vacuum structures containing a photocathode, a microchannel plate and a phosphor. Microchannel-plates amplify the photocathode electrons produced by dim-light photons, by collisions with the glass walls of the MCP, and these electrons, in turn, produce increased levels of visible light via collision with the phosphor. In photon counting applications, a microchannel plate or photomultiplier tube increases the single-photon signal level above the sensor noise, thereby increasing sensitivity of the sensor to the level at which photon counting can be performed. In a digicon the electron emitted by a photocathode is guided by a magnetic field and accelerated by an electric field, to energies of thousands of electron volts. The photoelectron impacts a silicon diode array and amplification results by impact onization which requires only about 3.3 eV to produce an lectron-hole pair in silicon.

Currently there are no photocathodes for x-rays, wavelengths shorter than about 0.01 microns. Therefore x-ray signal amplification first requires the conversion of x-rays to photons in the visible spectrum using scintillators or phosphors. These visible photons can then be amplified by conventional photocathode technologies discussed above. The problems with this amplification method stem from the inefficient conversion of x-rays to visible-light photons and with the poor quantum efficiencies of the photocathodes that can detect the scintillator-produced photons. Typically 50 eV of x-ray energy is required for a visible photon and photocathode quantum efficiencies are below 20%. Thus about 250 eV is required for each visible photon detected or for each electron emitted from the photocathode. In contrast the photocathode of the present invention would require only about 3.3 eV for each electron emitted. Furthermore the statistical noise of the photocathode of the present invention is less than a scintillator because the individual ionization events in the present invention are not completely independent.

There are many applications which require the discrimination of x-ray or gamma-ray energy. Nuclear medicine requires the discrimination of non-scattered gamma-rays from scattered gamma-rays to determine the absorption of radioactive compounds in tissue with sensors outside the body. The more accurately the energy discrimination can be done the faster the analysis can be achieved. However, the inefficiency of scintillator, gamma-ray-photon to visible-photon conversion limits the accuracy of energy discrimination. Energy resolution increases as the energy required to obtain a photocathode electron decreases. Energy resolution is also related to the statistics of x-ray or gamma-ray photon detection.

High-count-rate x-ray detectors are important in many areas of science where there is a Large background and high signal-to-noise ratio is obtained by energy discriminating the signal from the background. Generally solid-state detectors are used instead of scintillators to achieve this accuracy because of the high efficiency of conversion of x-ray energy to electron-hole pairs.

Solid-state detectors do not normally include amplification so signal filtering is required to reduce noise and limit uncertainty. This filtering, however, reduces the speed of operation, limiting the flux of photons that the sensor can process without saturation. Application examples are the non-invasive high-speed quantitative measure of lead in bones and other elements in other organs. (I. L. Preiss and M. A. Tariq On the use of L x-ray fluorescence for bone lead evaluation, Radiocanal. Nucl. Chem. Let. 164 (6), 381–385 (1992), I. L. Preiss and T. PTAK, Trace Element Profiles of Biological Samples Using Radioscope X-ray Fluorescence, Nuclear Instruments and Methods in Physics search A242 (1986) 539–543.) Data collection is particularly limited in structural biology investigations of dilute samples where detectors have not kept pace with synchrotron source development. The Extended X-ray Absorption Fine Structure (EXAFS) technique, counting fluorescent x-rays, has been known for some time, for example, but the counters have very limited data rates which cannot adequately take advantage of current and future synchrotron source fluxes.(J. Jaklevic et al, Solid State Communications, 23, 679 (1977)) Many samples have low concentrations of the element of interest which is embedded in a matrix of energy absorbing molecules. Under these conditions conventional detectors expend their count rate separating the desired-element-fluorescence x-rays from the larger number of quasi-elastic and matrix-fluorescence x-rays. A widely used x-ray fluorescence-detected spectroscopy detector is the 13-element Canberra Ge Detector (S P. Cramer et al, A 13-Element Ge Detector For Fluorescence EXAFS, Nuclear Instruments and Methods in Physics Research, A266, D586 (1988)). Cramer et al shows the count rate of a single detector element, using a 1 $\mu$s shaping time (electronic noise of about a few hundred eV) corrected for dead time losses, is about $2 \times 10^5$ photons/sec). This count rate is inadequate for many synchrotron-based experiments and the energy resolution is far from optimal.

BRIEF DESCRIPTION OF THE PRESENT INVENTION

The Advanced Semiconductor Emitter Technology for X-rays (ASET-X) photocathode devices described in this patent combine solid-state detector and emitter technologies into one device with very significant advantages over existing photocathode technology and x-ray or gamma-ray detector technology. In the present invention x-rays or gamma-rays are converted to electrons directly without the need for scintillators or phosphors. The direct conversion greatly decreases noise and allows much higher x-ray energy discrimination than previously possible. In addition the elimination of scintillators greatly simplifies the amplifier, reducing both the volume and cost of the associated x-ray sensor. ASET-X utilizes solid-state detector materials with high x-ray stopping power to convert x-rays to electrons and consequently high quantum efficiency is achieved for lower energy x-rays. These detector materials can not be used as photocathodes themselves but in combination with solid-state emitter technology they become very efficient x-ray photocathodes. One of the virtues of the x-ray photocathodes is that they can be combined with electron amplification technologies in an evacuated enclosure for high-speed, counting and energy discrimination of individual x-ray or gamma-ray photons. Energy resolution of x-rays or gamma-rays is the highest possible, with the present invention, limited only by detector ionization statistics. Energy resolution degradation resulting from sensor and electronic noise is eliminated by the signal amplification. One such embodiment, which incorporates a diode array in the vacuum enclosure is called the proximity-focused photon sensor. Other embodiments incorporate MCPs and dynodes in the evacuated enclosure and still others combine digitizing and counting electronics with the photon detector.

It is the object of the present invention to provide Advanced Semiconductor Emitter Technology for X-rays (ASET-X) Photocathode devices. The x-ray or gamma-ray energy detected is greater than about 0.1 keV or wavelengths shorter than 0.01 microns. Quantum efficiency is nearly 100% for lower energy x-rays and gamma-rays, and generally decreases with photon energy and increases with the atomic number of the solid-state material.

It is a further object of the present invention to provide high-speed, high-energy resolution signal amplification sensors incorporating ASET-X photocathodes.

It is still further the object of the present inventions to provide high-speed, high-energy-resolution photon counters incorporating ASET-X photocathodes.

Yet another object of the present invention is to provide sensors for visualizing or imaging x-ray or gamma-ray sources.

DETAILED DESCRIPTION OF A PREFERRED EMBODIMENT OF THE PRESENT INVENTION

Figure 1:
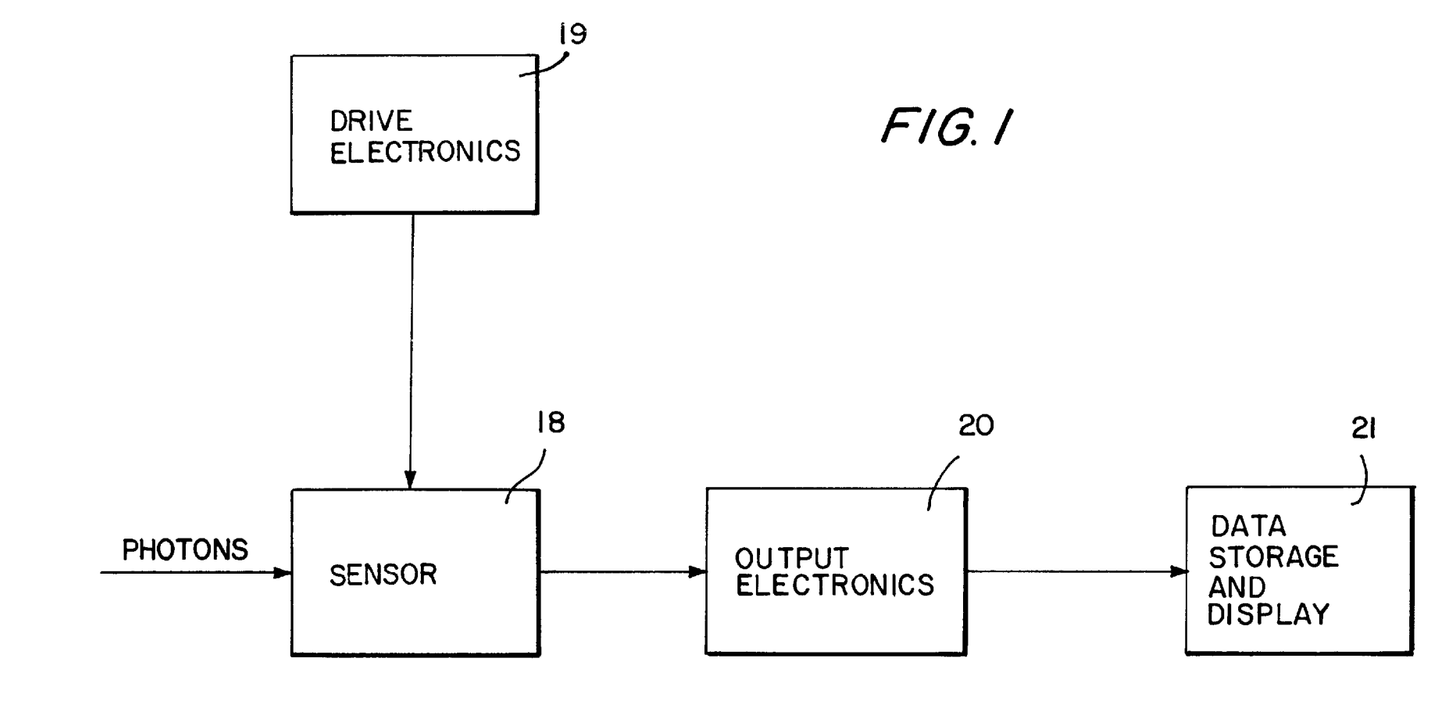
FIG. 1 is a block diagram of a preferred photon counting and/or energy discrimination device employing the ASET-X photocathode device. The block diagram also relates to a preferred imaging device for x-ray or gamma-ray sources.

FIG. 1 depicts a high-speed photon counting and/or energy discriminations system. The sensor 18 is connected to drive electronics 19 and output electronics 20. The sensor 18 consists of one or more sensor modules 17. The output electronics is connected to data storage and display electronics 21.

Figure 2:
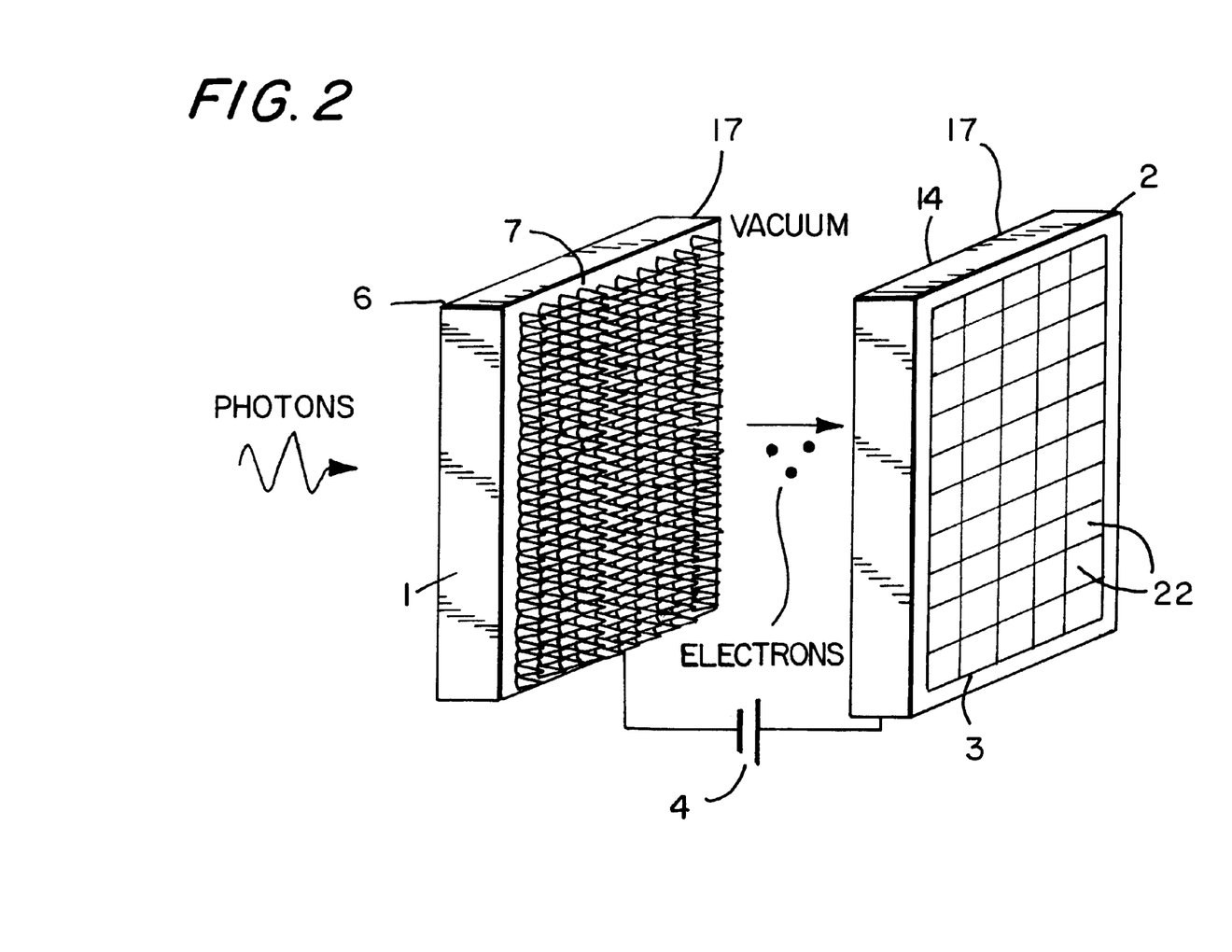
FIG. 2 is a perspective view of a preferred embodiment of the present invention, the proximity-focused photon sensor module employing the ASET-X photocathode device and a readout chip structure at the anode for electrical signal output.
Figure 4:
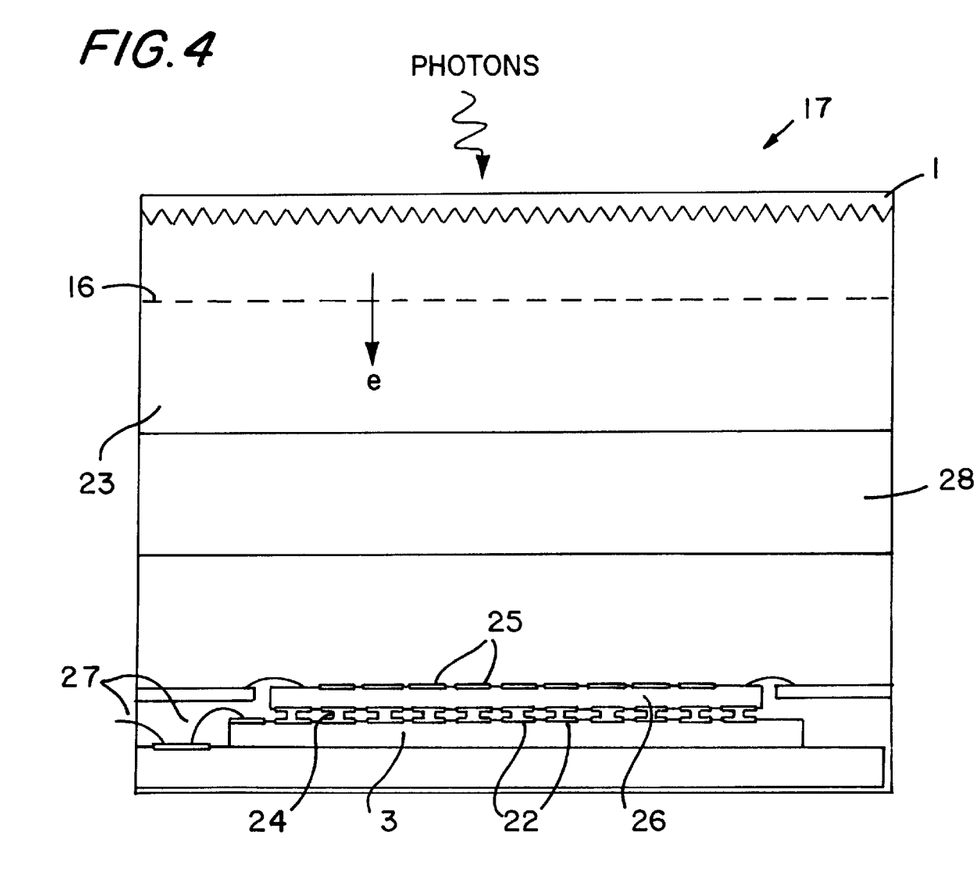
FIG. 4 is a side view of a preferred embodiment of the present invention, the microchannel plate image tube sensor module employing the ASET-X photocathode and a readout chip structure for electrical signal output.

A preferred embodiment of the present invention, the proximity-focused photon sensor module using ASET-X as a photocathode device, is described. The proximity-focused sensor module 17 is depicted in FIG. 2 and is capable of detecting an x-ray photon, with high efficiency, high-speed and low noise. The proximity focused sensor module in FIG. 2 is comprised of an ASET-X photocathode device 1, a diode array 2 with a corresponding readout unit cell electronics array 3, fabricated on the front side of the diode array, and a voltage source 4 which accelerates electrons emitted from the photocathode device 1, through a vacuum, into the diode array 2. The diode array is comprised of an array of individual diodes which is associated with an array of individual unit cell 22 electronics. Alternatively the diode array 2 and readout array 3 can be fabricated as two chips and bonded together, where each diode is electrically connected to an associated readout electronics unit cell by a metal bump. (A side view of the bump 24 bonding of two chips is illustrated in FIG. 4.) The back contact 14 of the diode array 2 is the anode for the ASET-X photocathode device 1. Typical dimensions of the arrays are a few square millimeters (mm) to a few hundred square centimeters. A typical number of individual diodes in the diode array and readout electronics unit cells in the readout array are 8×8 to 1000×1000. A typical distance between the photocathode and the anode is 1 mm and a typical source voltage 4 is 10 kilovolts. Typically the components in FIG. 2 are bounded by a tube.

An alternative embodiment of the sensor module 17 of the present invention substitutes a (Charged Coupled Device) CCD for the diode 2 and readout array 3 in FIG. 2.

Figure 3:
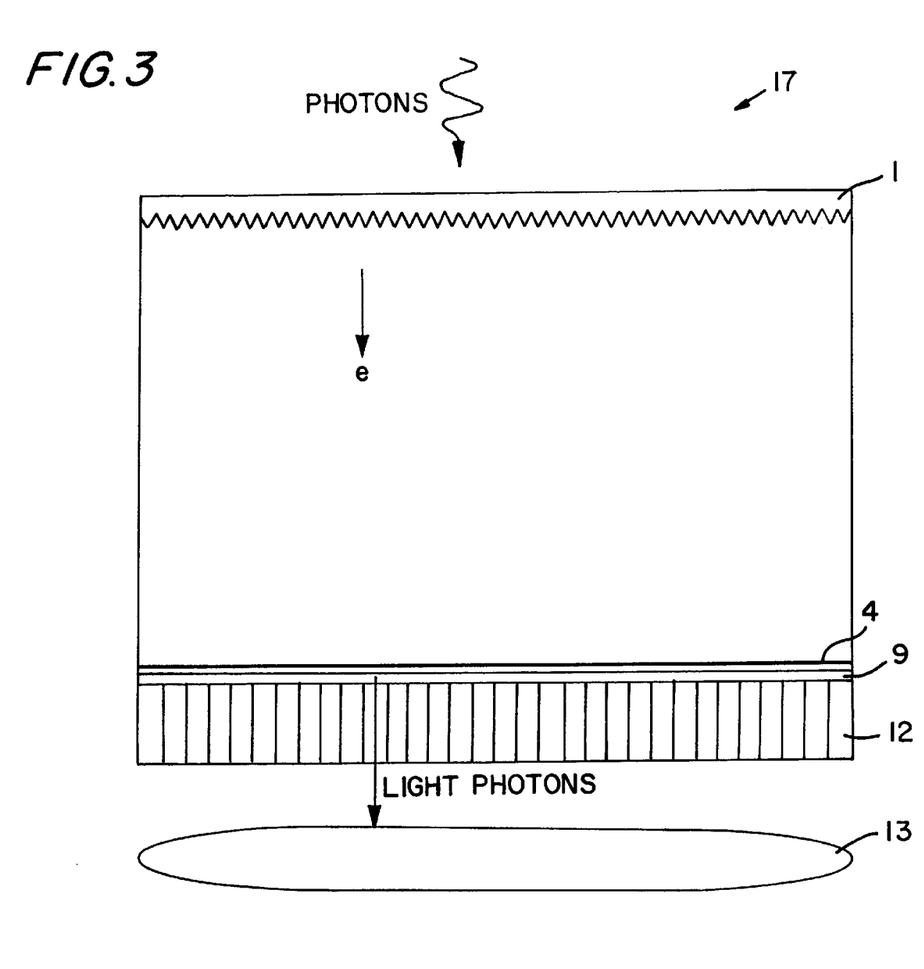
FIG. 3 is a side view Df a preferred embodiment of the present invention, the proximity-focused photon sensor module employing the ASET-X photocathode device and a phosphor at the anode for photon output.

An alternative embodiment of the sensor module 17 of the present inventions shown in FIG. 3 substitutes a thin metal cathode 4, a phosphor 9, and a transparent window 12 for the diode 2 and readout array 3 in FIG. 2. Typically the transparent window 12 is a fiber optics plate. In many applications an optical system 13 is coupled to the output of the sensor module. In other embodiments, particularly imaging embodiments of the present invention, a CCD or a diode array bonded to a readout electronics unit cell array is coupled to the photon output of the sensor module.

Alternative embodiments of the sensor modules 17, of the present invention includes a magnetic field perpendicular to either the diode array, CCD array or phosphor in FIGS. 2 and 3.

An alternative embodiment of the sensor module of the present invention, the microchannel plate (MCP) Image tube sensor module 17 is depicted in FIG. 4. All components are enclosed in a tube 23. Electrons are emitted from the ASET-X photocathode 1, are amplified in the MCP 28, and are collected by an anode array 26. The anode array 26 may be bump 24 bonded to a readout unit cell electronics array 3, each anode 26 to a corresponding readout electronics unit cell 22, and data multiplexed off the readout unit cell array 3 by means of wire bonds 27. Typically each anode 25 of the anode array is a metal square, each with linear dimensions 50 to 5000 microns.

Alternatively each of the anodes may be separately output through the tube wall.

Similar to the proximity focused sensor module in FIG. 3, a thin metal cathode 4, a phosphor 9, and a transparent window 12 may replace the FIG. 4 anode array in an alternative MCP image tube sensor module with a photon output. The transparent window is transparent to phosphor photons. The photon output MCP image tube sensor may be coupled to an optical system (as 13 in FIG. 3) or a CCD or diode array bonded to a readout electronics unit cell array.

Another alternative design is to replace the MCP 28 in FIG. 3 with dynodes to make a photomultiplier tube (PMT).

In all the embodiments of the MCP image tube sensor module 17 an electron transparent screen 16 may interposed between the photocathode 1 and MCP 28 and used to bias the cathode.

Figure 5:
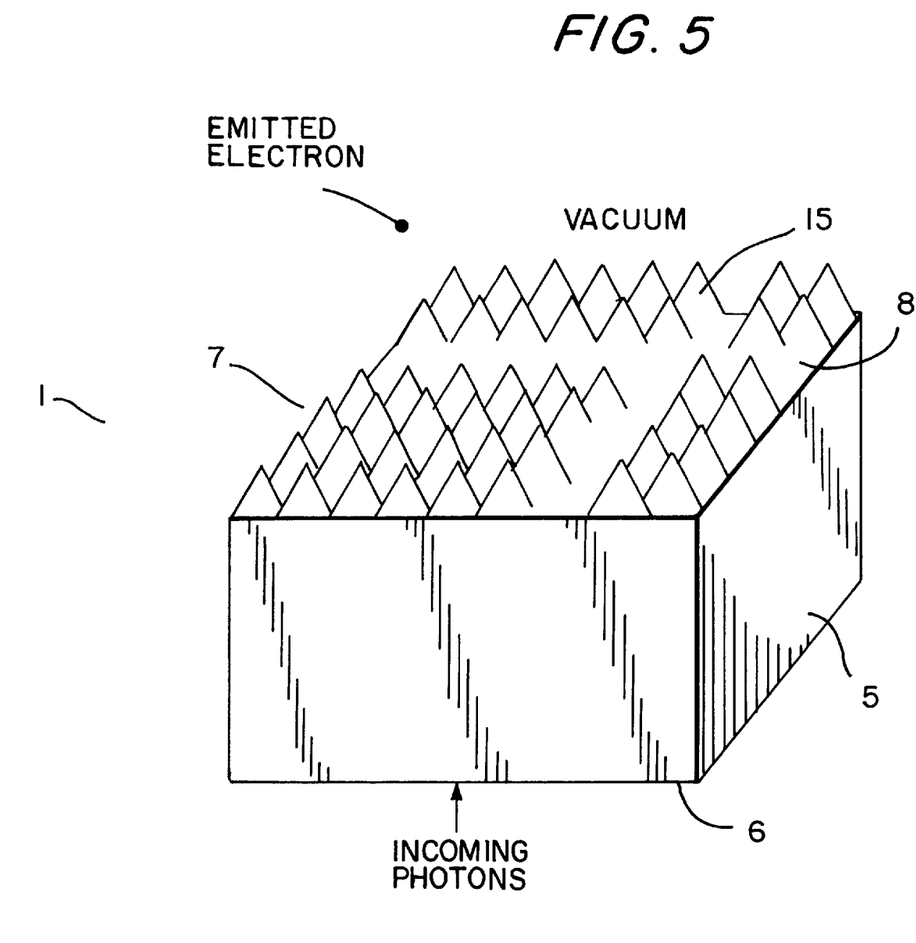
FIG. 5 is a perspective view of a preferred embodiment of the ASET-X photocathode device.
Figure 6:
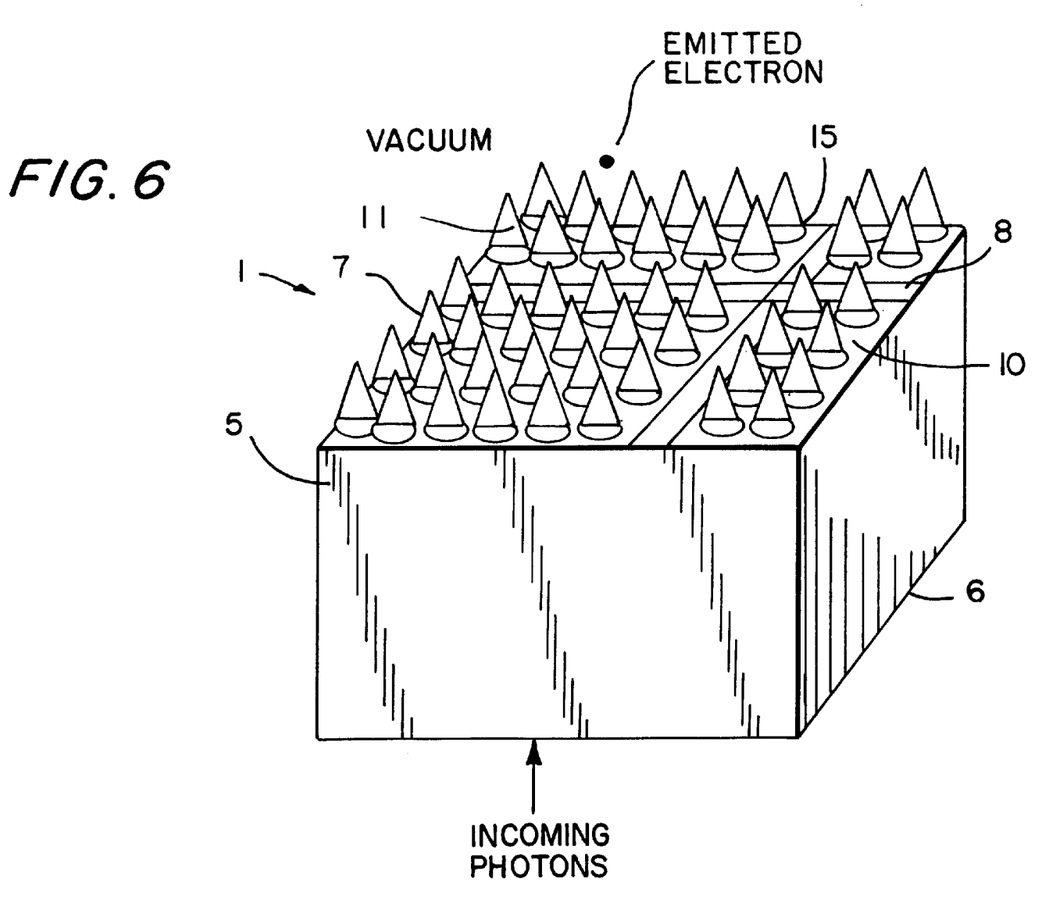
FIG. 6 is a perspective view of another preferred embodiment of the ASET-X photocathode device.

Preferred embodiments of the ASET-X photocathode device are also described. A small section of the first embodiment is depicted in FIG. 5 and a small section of the second embodiment is depicted in FIG. 6. All embodiments, absorb x-ray photons and emit electrons. The ASET-X photocathode device is capable of detecting an x-ray photon, with high efficiency, when used with a suitable electron amplification means in a sensor module as discussed above.

The first preferred embodiment of the ASET-V photocathode device, a small section of which is depicted in FIG. 4, comprises a detector structure 5, a backside electrical contact or cathode 6, and an emitter structure 7. The emitter structure is composed of an array of tiny cone-shaped emitters 15. This cone-shaped emitter array is either continuous or interrupted by pixel spaces 8 which define pixels. The detector and emitter structures may be one continuous piece of semiconductor material or fabricated from epitaxial layers. A typical piece of material would be a crystalline silicon wafer 100 mm in diameter and 1 mm thick. Typical pixel dimensions are 30 $\mu$m to 300 $\mu$m. One ASET-X might take up the whole wafer or just a small portion of it. Typically the contact 6 is either ion-implanted in the wafer or a highly doped epitaxial contact layer is grown on the back surface of the wafer. Typical dimensions of the cone-shaped emitters are 3 to 20 microns ($\mu$m) in height and 3 to 20 microns in base diameter. The emitter tip radius is typically 50 to 500 Angstroms.

The second preferred embodiment of the ASET-X photocathode 1, a section of which is depicted in FIG. 3, comprises a detector structure 5 a backside electrical contact 6 and an emitter structure 7. The emitter structure is composed of an array of tiny cone-shaped emitters 15. The cone-shaped emitter array can be continuous or interrupted by pixel spacing 8. The SET-X photocathode is further composed of a thin contact or hield 10, which covers the lower part of the emitters and the surface between them leaving, the emitter tip 11 uncovered. In an alternative embodiment of the ASET-X photocathode 1 the thin contact covers the whole emitter structure 7 including the entire cone-shaped emitter 15 and the area between emitters. In still another embodiment of the ASET-X photocathode 1 the thin contact or shield 10 covers only the emitter tip 11 and not the base of the cone-shaped emitter and not the space between the emitters. Typically the thickness of the thin shield is 10–1000 Angstroms and typically the thin contact is a metal like gold, aluminum or platinum.

In one mode of operation gamma-ray or x-ray photons enter the sensor 18 in FIG. 1 and an electrical charge signal is created representative of the energy of each of the photons. The drive electronics 19 determines the length of integration and sends control signals to the sensor to transfer the photon signals to output electronics 20. The integration time is short enough so that no more than one photon interacts with any particular detector on the detector array 2 in the sensor module 17, in one integration time. The sensor 18 is made up of one or more sensor modules 17. The output electronics 20 rejects the background photon signals using analog processing and digitizes the desirable photon signals. The desirable signals are then separated into energy bins (i.e. intervals) according to the magnitude of the photon signal, using pipeline processing, and counted. Alternatively the output electronics can digitize all the signals and the background separation and energy binning done in the pipeline. The importance of performing the background separation first is that a higher photon flux can usually be accommodated; in many applications the background dominates the photon flux. Alternatively the background discrimination and energy binning and counting can be done in analog circuitry simultaneously for the highest photon flux. The number of photons in each energy bin is then transferred to data storage and display circuitry 21. In the energy-discrimination and counting mode the output of the sensor modules are electrical signals.

In an alternative imager mode of operation, in which the output of the sensor modules 17 are photons, the drive electronics 19 in FIG. 1 sets the integration time so that one or a plurality of photons interact with each detector in the sensor module 17 in one integration time. The photon output of the sensor modules forms an image of the gamma-ray or x-ray source, by means of optics or lenses 13, on output electronics 20 CCD or a diode array bonded to a readout electronics unit cell array which convert the photons to electrical signals. Each diode is a pixel of the image. These electrical signals are digitized and displayed as an image in the data storage and display 21 portion of the system.

The sensor 18 is made up of one or more sensor modules 17. A photon entering the ASET-X photocathode 1 in FIGS. 2 or 3, creates one or a plurality of electron hole pairs in the detector structure 5 (FIGS. 5 or 6) and the electron is emitted from one of the cone-shaped emitters 15 of the emitter structure 7. In FIG. 2 the electron is then accelerated by the voltage source 4 until it achieves an energy that will allow penetration into the diode array 2 as well as the creation of many additional electron-hole pairs in the individual diodes by impact ionization. The diode separates the electron-hole pairs and the electrons are collected in the associated readout electronics unit cell 22 in the readout array 3. One unit cell 22 in the readout array 3 is associated with each diode in the diode array 2. The energy required to create an electron-hole pair in the diode is about three times the band gap of the diode semiconductor material and so electron amplification factors larger than 1000 are easily possible. This large amplification produces a photon signal larger than the readout noise so that even a single-photon signal is large enough to be detected. If a CCD array is substituted for the diode array 2 and readout array 3, operation is substantially the same as described for the diode array and readout array and an electrical signal is output from the sensor module. In general diode arrays 2 associated with readout arrays 3 offer a higher speed output than CCD arrays. If a thin metal cathode 4, a phosphor 9, and a transparent window 12 is substituted for the diode array 2 and readout array 3, as in FIG. 3, photons generated in the phosphor 9 by the accelerated electrons are transferred out of the vacuum by the window 12. Typically the window is a fiber optics plate. If the phosphor generated photons are in the visible spectrum they can be viewed directly, using the required optics 13, yielding a device by which a human can see x-ray sources. Alternatively the diode array 2 and readout array 3 or a CCD could be placed outside the tube to convert phosphor-generated photons to electrical signals and output the electrical signals to the output electronics 20 of an x-ray or gamma-ray source imaging device.

If a magnetic field perpendicular to the plane of the ASET-X photocathode 1 were used, operations would be the same as described above except that the emitted electrons would not spread into contiguous pixels as much as without the magnetic field. A magnetic field increases spatial resolution by reducing crosstalk.

With ASET-X photocathode operation the voltage 4 in FIG. 2 is large enough to deplete most of the semiconductor between the emitter structure 7 and the backside contact 6, in FIG. 2, creating a depletion electric field in this region. A photon penetrating the backside contact 6 or cathode, in FIG. 2, is absorbed in the bulk of the semiconductor, which is the detector structure 5 (FIGS. 4 and 5). X-ray or gamma-ray photon absorption generates a plurality of electron-hole pairs in a solid-state detector structure. The depletion electric field sweeps the electron into the emitter portion of the structure and the hole to the cathode 6. In this way ASET-X photocathode device functions very much like a back-biased diode detector.

Near the emitter structure the internal and external fields are increased by the shape of the cone-shaped emitters. The fields are increased to a level at which field emission occurs into the vacuum, at the cone-shaped emitter tips, with high probability. Once the electron is outside the semiconductor material it can be accelerated in a number of ways leading to electron multiplication or amplification. The concentration of the back contact 6 doping times its depth must be small in comparison to the reciprocal of the absorption cross section of the photons of interest, to prevent absorption of a substantial fraction of the photons in the contact.

Operation of the MCP Image Tube sensor module 17 in FIG. 3 is as follows. An x-ray or gamma-ray photon is absorbed by the ASET-X photocathode 1 and the electrons created are emitted into the vacuum. These electrons are accelerated by a voltage into the MCP 28 where the electrons are multiplied inside the tubes of the MCP. A screen 20 with a large transmission area may be placed between the ASET-X photocathode 1 and the MCP 28 for the purpose of biasing the photocathode. Electrons exiting the bottom of the MCP 28 are accelerated by a voltage onto an anode 25 of an anode array 26 and the charge stored and output from a corresponding readout unit cell 22 in the readout electronics unit cell array 3. The MCP 28 in FIG. 3 could be replaced by one or a plurality of dynodes resulting in a single PMT or an array of PMTS. Alternatively a phosphor and phosphor-photon transparent window may replace the anode array. Operation will then be similar to the proximity-focused sensor 17 (FIG. 3) with a thin metal cathode 4, a phosphor 9, and a transparent window 12 replacing the diode array 2 and readout array 3.

The ASET-X detector structure 5, in FIGS. 4 and 5 is typically a high resistivity p-type semiconductor substrate in which a cathode 6 has been implanted on one side of the substrate and cone-shaped emitters 15 have been etched directly into the other side of the semiconductor substrate. If the ASET-X detector structure 5 is fabricated from 0.05 cm thick silicon wafer, the quantum efficiency is 100% for x-ray photons below 8 keV, about 94% at 12 keV and about 28% at 25 keV. Increasing the detector structure 5 thickness will increase quantum efficiency and increasing the atomic number, for example using germanium instead of silicon, will increase the quantum efficiency for higher energy photons; photons whose energies are greater than 8 keV for example.

Very low resistivity substrates are required so that the cathode-anode voltage difference, 4 in FIG. 1 for example, will deplete throughout the detector volume while also generating a high enough field at the tips of the emitters 7 to cause field emission of the electrons. For a silicon detector structure the resistivity may be in the 10,000 to 30,000 ohm/cm range, for example. The anode is external to the photocathode device; in particular it is the back contact 14 of the diode array in FIG. 1. The field at the emitter tips is related to the depletion depth and doping concentration of the detector structure (or equivalently the voltage between the anode and cathode) and on the shape of the emitter structure.

The ratio of the emitter tip height to the emitter tip radius is a measure of the amplification of the electric field by the emitter tips. Where a metal shield covers the entire emission surface the field amplification is the largest for a given emitter tip radius and height. Partial covering of the emission surface by the shield, as in FIG. 3, typically gives a lower field amplification than complete covering of the emitter structure. Typically, however, the effective work function (related to the barrier that must be overcome to obtain emission into the vacuum) is larger for metal shields than bare semiconductor so optimization of the extent that the metal shield 10 covers the emitter structure 7 is necessary. Metallization of the emitter structure 7 also prevents the development of an oxide on or contamination of the semiconductor surface and must also be considered in the emission optimization. Under some circumstances metallization of the emitters 15 alone may be required. Under other circumstances the metal shield may be used as a separate contact to bias the ASET-X photocathode.

Typically the shield is applied by evaporating the desired metal on a photoresist-masked emitter structure 7 surface. The photoresist and undesired metal is removed at the same time after the metallization process. This is also known as a lift-off process. Alternatively the emitter structure surface could be selectively etched after metallization to remove the undesired metal.

An ASET-X photocathode used with visible or IR photons whose energies are above the bandgap of the semiconductor material will operate as an effective photocathode for these photons, as well as x-ray or gamma-ray photons, as long as most of the photons are not absorbed in the electrical cathode contact 6. In the x-ray or gamma-ray photon photocathode mode the quantum efficiency is not determined by the semiconductor properties of the material, that is by the outer electrons of the semiconductor atoms, but by the photoelectric properties of the inner shell electrons.

What is claimed is:

1. An energy resolving and counting device for resolving a flux of x-ray or gamma-ray photons, which has an energy spectrum, into one or a plurality of energy bins, for counting the number of photons in each energy bin and for storing and displaying the results comprising one or a plurality of sensors for absorbing the photons producing separate electrical signals for each photon representative of the energy of each photon, drive electronics to control the integration time of the sensor and control the transfer of signals to output electronics and to data storage and display circuitry said output electronics separating the photon signals into the energy bins, digitizing the photon signals and counting the photons in each energy bin, data storage and display circuitry storing count information and displaying the count information, said sensor(s) comprising
a photocathode device for absorbing the photon and emitting one or a plurality of electrons,
amplification means to multiply the number of electrons and
readout means to convert the electrons into an electrical signal said photocathode device comprising
detector structure means for absorbing the photons and creating one or a plurality of electron-hole pairs,
voltage means for creating electric fields within and outside the device to separate the electrons from holes and aid in electron emission,
electrical contacts and shields to create, shape and amplify the electric fields from the voltage means,
emitter structure means comprising cone-shaped emitters to transfer the electron from the inside of the device to the outside of the photocathode device.

2. The energy resolving and counting device of claim 1, wherein the electron amplification means in the sensor is a microchannel plate.

3. The energy resolving and counting device of claim 2, comprising an anode, which is an array of metal anodes bonded to an array of readout electronics unit cells.

4. The energy resolving and counting device of claim 3, wherein the readout electronics multiplexes the electrical signals from the anode.

5. The energy resolving and counting device of claim 2, wherein the anode is an array of metal anodes and each metal anode is independently output from the sensor.

6. The energy resolving and counting device of claim 1, wherein a magnetic field in the sensor is used to reduce pixel crosstalk.

7. The energy resolving and counting device of claim 1, wherein the amplification means in the sensor is one or a plurality of dynode arrays.

8. The energy resolving and counting device of claim 1, wherein the amplification means in the sensor causes electric field acceleration of the electron and subsequent collision with a solid-state device.

9. The energy resolving and counting device of claim 8, wherein the solid-state device is an array of diodes bonded to an array of readout electronics unit cells.

10. The energy resolving and counting device of claim 8, wherein the solid-state device is a Charged Coupled Device.

11. The energy resolving and counting device of claim 1, wherein the amplification means in the sensor causes electric field acceleration of the electron and subsequent collision with a phosphor or scintillator.

12. The energy resolving and counting device of claim 1, comprising means for separation of the background by analog processing and means for energy resolution by digital processing after analog to digital conversion of the photon signals.

13. The energy resolving and counting device of claim 1, comprising means for energy resolution of the photon signals by analog processing and means for counting by digital processing.

14. The energy resolving and counting device of claim 1, means for the separation of the background and energy resolution by digital processing after analog to digital conversion of the photon signals.

15. An x-ray, gamma-ray, visible or infrared photon sensor comprising
a photocathode device for absorbing the photon and emitting one or a plurality of electrons,
amplification means to multiply the number of electrons and
readout means to convert the electrons into an electrical signal,
said photocathode device comprising
detector structure means for absorbing the photons and creating one or a plurality of electron-hole pairs,
voltage means for creating electric fields within and outside the device to separate the electron from the hole and aid in electron emission,
electrical contacts and shields to create, shape and amplify the electric fields from the voltage means,
emitter structure means comprising cone-shaped emitters to transfer the electron from the inside of the device to the outside of the photocathode device.

16. The photon sensor of claim 15, wherein the amplification means is a microchannel plate.

17. The photon sensor of claim 16, having an anode that is an array of metal anodes bonded to an array of readout electronics unit cells.

18. The photon sensor of claim 17, wherein the readout electronics multiplexes the electrical signals from the anode array off the sensor.

19. The photon sensor of claim 17, wherein of each metal anode is independently output from the sensor.

20. The photon sensor of claim 15, wherein a magnetic field is used to reduce pixel crosstalk.

21. The photon sensor of claim 15, wherein the amplification means is one or a plurality of dynode arrays.

22. The photon sensor of claim 15, wherein the amplification means causes electric field acceleration of the electron and subsequent collision with a solid-state device.

23. The photon sensor of claim 22, wherein the solid-state device is an array of diodes bonded to an array of readout electronics unit cells.

24. The photon sensor of claim 22, wherein the solid-state device is a Charged Coupled Device.

25. The photon sensor of claim 15, wherein the amplification means causes electric field acceleration of the electron and subsequent collision with a phosphor or scintillator.

26. A photocathode device for absorbing a photon and emitting one or a plurality of electrons comprising
detector structure means for absorbing the photon and creating an electron-hole pair,
voltage means for creating electric fields within and outside the device to separate the electron from the hole and aid in electron emission
electrical contacts and shields to create and shape the electric fields from the voltage means,
emitter structure means comprising
cone-shaped emitters to transfer the electron from the inside of the device to the outside of the photocathode device, wherein the emitter structure means is composed of cone-shaped emitters which are greater than 3 $\mu$m and less than 20 $\mu$m tall.

27. A photocathode device for absorbing a photon and emitting one or a plurality of electrons comprising
detector structure means for absorbing the photon and creating an electron-hole pair, voltage means for creating electric fields within and outside the device to separate the electron from the hole and aid in electron emission electrical contacts and shields to create and shape the electric fields from the voltage means, emitter structure means comprising cone-shaped emitters to transfer the electron from the inside of the device to the outside of the photocathode device, wherein a layer of material is deposited on all or part of the emitter structure.

28. The device for absorbing a photon and emitting one or a plurality of electrons of claim 27, wherein the layer of material is a metal.

29. A device for imaging a source of x-ray or gamma-ray photons comprising one or a plurality of sensors for absorbing gamma-ray or x-ray photons producing amplified light photon signals for each x-ray or gamma-ray photons optics to focus the light photons on detector means in output electronics said output electronics converting the light photon signals into electrical signals and to digitize the electrical signals, drive electronics to control the integration time of the sensor and control the transfer of signals from the output electronics to the data storage and display circuitry, data storage and display circuitry to display and store the x-ray or gamma-ray source image, said sensors comprising a photocathode device for absorbing the photon and emitting one or a plurality of electrons, amplification means to increase the photon signal said photocathode device comprising detector structure means for absorbing the photons and creating one or a plurality of electron-hole pairs, voltage means for creating electric fields within and outside the device to separate the electrons from the holes and aid in electron emission electrical contacts and shields to create, shape and amplify the electric fields from the voltage means, emitter structure means comprising cone-shaped emitters to transfer the electron from the inside of the device to the outside of the photocathode device.

30. The device for imaging a source of x-ray or gamma-ray photons of claim 29, wherein amplification means in the sensor is a microchannel plate, and a phosphor.

31. The device for imaging a source of x-ray or gamma-ray photons or claim 29, wherein amplification means in the sensor causes electric field acceleration of a photocathode produced electron and subsequent collision with a phosphor or scintillator.

32. The device for imaging a source of x-ray or gamma-ray photons of claim 29, wherein the detector means in the output electronics is a charged coupled device.

33. The device for imaging a source of x-ray or gamma-ray photons of claim 29, wherein the detector means in the output electronics is a diode array coupled to a readout electronics unit cell array.

34. A device for imaging a source of x-ray or gamma-ray photons comprising one or two sensors for absorbing gamma-ray or x-ray photons producing amplified light photon signals for each x-ray or gamma-ray photon, optics to focus the light photons on an eye, said sensor comprising a photocathode device for absorbing the photons and emitting one or a plurality of electrons, amplification means to increase the photon signals said photocathode device comprising detector structure means for absorbing the photons and creating one or a plurality of electron-hole pairs, voltage means for creating electric fields within and outside the device to separate the electrons from the holes and aid in electron emission electrical contacts and shields to create, shape and amplify the electric fields from the voltage means, emitter structure means comprising cone-shaped emitters to transfer the electron from the inside of the device to the outside of the photocathode device.

35. The device for imaging a source of x-ray or gamma-ray photons of claim 34 wherein the amplification means in the sensor is a microchannel plate, and a phosphor.

36. The device for imaging a source of x-ray or gamma-ray photons of claim 34, wherein the amplification means in the sensor causes electric field acceleration of a photocathode produced electron and subsequent collision with a phosphor or scintillator.

37. A photocathode device for absorbing a photon and emitting one or a plurality of electrons comprising detector structure means for absorbing the photon and creating an electron-hole pair, voltage means for creating electric fields within and outside the device to separate the electron from the hole and aid in electron emission electrical contacts and shields to create and shape the electric fields from the voltage means, emitter structure means comprising cone-shaped emitters to transfer the electron from the inside of the device to the outside of the photocathode device, wherein the detector structure means is Mercury Cadmium Telluride.

38. A photocathode device for absorbing a photon and emitting one or a plurality of electrons comprising detector structure means for absorbing the photon and creating an electron-hole pair, voltage means for creating electric fields within and outside the device to separate the electron from the hole and aid in electron emission electrical contacts and shields to create and shape the electric fields from the voltage means, emitter structure means comprising cone-shaped emitters to transfer the electron from the inside of the device to the outside of the photocathode device, wherein the detector structure means is Germanium.

39. A device for resolving a flux of x-ray or gamma-ray photons, which has an energy spectrum, into one or a plurality of energy intervals, for determining the quantity of flux in each energy interval and for storing and displaying the results comprising one or a plurality of sensors for absorbing the flux of photons and for producing separate electrical signals representative of the energy of photons absorbed on said sensors drive electronics to control an integration time of a sensor and to control the transfer of signals to output electronics and to data storage and display circuitry said output electronics associating the photon signals with energy intervals, and converting the photon signals to digital signals and to count the flux of photons in each energy interval data storage and display circuitry to store count information from said output electronics and to display the count information said sensor comprising
- a photocathode device for absorbing a portion of the photon flux and emitting one or a plurality of electrons,
- an amplifier to multiply the number of electrons from said photocathode device and
- readout electronics associating the electrons from the amplifier with an electrical signal said photocathode device comprising
- a detector structure that absorbs the photon flux and creates one or a plurality of electron-hole pairs,
- one or more voltage sources creating electric fields within and outside the device that separate the electrons from the holes
- electrical contacts and shields to create, shape and amplify the electric fields from the voltage means,
- emitters to transfer the electrons from the inside of the device to the outside of the photocathode device.

* * * * *